(12) United States Patent
Belenky et al.

(10) Patent No.: US 7,876,795 B2
(45) Date of Patent: Jan. 25, 2011

(54) SEMICONDUCTOR LIGHT SOURCE WITH ELECTRICALLY TUNABLE EMISSION WAVELENGTH

(75) Inventors: Gregory Belenky, Port Jefferson, NY (US); John D. Bruno, Bowie, MD (US); Mikhail V. Kisin, Centereach, NY (US); Serge Luryi, Setauket, NY (US); Leon Shterengas, Centereach, NY (US); Sergey Suchalkin, Centereach, NY (US); Richard L. Tober, Elkridge, MD (US)

(73) Assignees: Maxion Technologies, Inc., Hyattsville, MD (US); The Research Foundation of State University of New York, Albany, NY (US)

( * ) Notice: Subject to any disclaimer, the term of this patent is extended or adjusted under 35 U.S.C. 154(b) by 0 days.

(21) Appl. No.: 11/206,505

(22) Filed: Aug. 18, 2005

(65) Prior Publication Data
US 2006/0056466 A1    Mar. 16, 2006

Related U.S. Application Data

(60) Provisional application No. 60/602,750, filed on Aug. 19, 2004.

(51) Int. Cl.
*H01S 3/10*    (2006.01)
*H01S 5/00*    (2006.01)
(52) U.S. Cl. ..................... 372/20; 372/44.01
(58) Field of Classification Search .............. None
See application file for complete search history.

(56) References Cited

U.S. PATENT DOCUMENTS

| | | | | |
|---|---|---|---|---|
| 4,622,671 A | * | 11/1986 | Tsang ................ | 372/19 |
| 5,333,141 A | * | 7/1994 | Wolf et al. ............. | 372/20 |
| 5,588,015 A | * | 12/1996 | Yang ................. | 372/45.012 |
| 5,799,026 A | * | 8/1998 | Meyer et al. ........... | 372/45.01 |
| 5,901,168 A | * | 5/1999 | Baillargeon et al. ...... | 372/50.11 |
| 5,978,397 A | * | 11/1999 | Capasso et al. ......... | 372/45.01 |
| 6,404,791 B1 | * | 6/2002 | Yang ................. | 372/45.01 |

(Continued)

OTHER PUBLICATIONS

Sirtori et al., "Quantum cascade unipolar intersubband light emitting diodes in the 8-13μm wavlength region", Appl. Phys. Lett., Jan. 2, 1995, pp. 4-6, vol. 66(1).

(Continued)

*Primary Examiner*—Minsun Harvey
*Assistant Examiner*—Sean Hagan
(74) *Attorney, Agent, or Firm*—Alan G. Towner, Esq.; Pietragallo Gordon Alfano Bosick & Raspanti, LLP

(57) ABSTRACT

A semiconductor light source comprises a substrate, lower and upper claddings, a waveguide region with imbedded active area, and electrical contacts to provide voltage necessary for the wavelength tuning. The active region includes single or several heterojunction periods sandwiched between charge accumulation layers. Each of the active region periods comprises higher and lower affinity semiconductor layers with type-II band alignment. The charge carrier accumulation in the charge accumulation layers results in electric field build-up and leads to the formation of generally triangular electron and hole potential wells in the higher and lower affinity layers. Nonequillibrium carriers can be created in the active region by means of electrical injection or optical pumping. The ground state energy in the triangular wells and the radiation wavelength can be tuned by changing the voltage drop across the active region.

13 Claims, 17 Drawing Sheets

U.S. PATENT DOCUMENTS

2003/0043877 A1* 3/2003 Kaspi .......................... 372/45

OTHER PUBLICATIONS

Faist et al., "Laser action by tuning the oscillator strength", Nature, Jun. 19, 1997, pp. 777-782, vol. 387.

Sherstnev et al., "Tuning characteristics of InAsSb continuous-wave lasers", Applied Physics Letters, May 20, 2002, pp. 3676-3678, vol. 80, No. 20.

Thomas et al., "Widely tunable light-emitting diodes by Stark effect in forward bias", Applied Physics Letters, Aug. 26, 2002, pp. 1582-1584, vol. 81, No. 9.

Vasilyev et al., "Injection cascade lasers with graded gap barriers", Journal of Applied Physics, Mar. 1, 2003, pp. 2349-2352, vol. 93, No. 5.

Thomas et al., "Tunable laser diodes by Start effect", Applied Physics Letters, Aug. 18, 2003, pp. 1304-1306, vol. 83, No. 7.

* cited by examiner

SEMICONDUCTOR LIGHT SOURCE WITH ELECTRICALLY TUNABLE EMISSION WAVELENGTH

CROSS-REFERENCE TO RELATED APPLICATIONS

This application claims the benefit of U.S. Provisional Patent Application Ser. No. 60/602,750 filed Aug. 19, 2004, which is incorporated herein by reference.

GOVERNMENT CONTRACT

The present invention was supported by the United States Air Force Research Laboratory under Contract No. F19628-02-C-0032 and by the United States Department of Energy under Contract No. DE-FG02-02ER83492. The present invention was also supported by ARO Grant No. DAAD190310259 and AFOSR Grant No. F49620-00-1-0331. The United States Government has certain rights in this invention.

FIELD OF THE INVENTION

This invention relates generally to the field of tunable semiconductor electromagnetic radiation sources and, in particular, to an electrically tunable semiconductor source of electromagnetic radiation.

BACKGROUND INFORMATION

Tunable semiconductor light sources such as lasers and light diodes are in high demand for various applications such as countermeasures, remote sensing, environmental monitoring, and industrial process control. The term "tunable light source" is typically applied to a light source, wherein the wavelengths of the emitted radiation can be varied in a controlled manner.

Tunable mid-infrared (MID-IR) radiation sources in the wavelength region between 3 and 11 mm are now in high demand for the above mentioned applications. Molecular absorption lines of various chemical substances such as water, carbon monoxide, sulfur, carbon and nitrogen dioxides, methane, nitric oxide, acetylene, ozone, ammonia, formaldehyde, etc. are within the specified wavelength range. The magnitude of the radiation absorption at a resonant wavelength is proportional to the concentration of the corresponding substance. The wavelength of the radiation source should be exactly matched to the absorption line of the substance detected, therefore, the tuning range of the radiation source is one of the most important parameters of the device.

There are two basic ways to control the frequency of radiation. The first method uses the change of the characteristic frequencies of light emitter material or structure as a result of changing the structure temperature, current, voltage, strain or other control parameters. The second method implies selection of different frequencies from a sufficiently broad emission spectrum of the light emitter. The latter approach is mostly applicable to semiconductor lasers and is based on the control of the frequency dependent cavity loss and/or effective refraction index, which can be used to select the emission frequency. Technically, this method can be realized in an external cavity semiconductor laser. The combination of these two general methods is also possible.

The first method generally provides wider tuning range than the second, since in the latter case the tuning range is restricted by the width of the emission or amplification spectrum of the emitter. Conventional tunable semiconductor emission sources in the MID-IR range are lead-salt and antimonide-based lasers and light-emitting devices (LED), and recently implemented quantum cascade lasers (QCL). The lead salt laser diodes cover spectral range from 3 to 30 mm. Rough wavelength tuning is done by controlling the device temperature. The tunability range of a single device can reach up to 10% of the central wavelength. Diode lasers based on (AlGaIn)(AsSb) system work in the 2-3 mm range (Simanowski S, Mermelstein C, Walther M, Herres N, Kiefer R, Rattunde M, Schmitz J, Wagner J, Weimann G, Journal of Crystal Growth, 227, 595 (2001)) with temperature tuning wavelength range about 4 to 5%.

In addition to temperature tuning, injection current tuning is commonly used for fine wavelength adjustment. Laser tunability over 7.5 cm$^{-1}$ by changing the bias current and 3.5 cm−1 by changing the heat sink temperature have been reported for InAsSb cw lasers emitting at 3.3 µm (V. Sherstnev, A. Krier, A. Popov, P. Verle, Appl. Phys. Lett. 80, 3676 (2002). Despite the fact that temperature control was proved to be a good method for coarse wavelength tuning, it is the electrical tuning which provides the finest frequency adjustment and the fastest time response. The range of the electrical tuning in both lead salt and antimonide based MID-IR diode lasers and LEDs is relatively small, so that the electrical tuning in these devices can be used only in combination with temperature tuning, which provides wide enough tuning range.

The physical reason for electrical wavelength tuning can be either the change of the effective refraction index of the active area with the bias current or the change of the optical transition energy due to the change of the voltage drop across the active region (Stark shift). The Stark effect is an effective tool for broad wavelength tuning. Quantum cascade unipolar intersubband light emitting diodes electrically tunable in the 8-13 mm range was reported by C. Sirtory, F. Capasso, J. Faist, D. Sivco, A. Hutchinson and A. Cho (APL, v.66, 4 (1995)).

Light-emitting diodes with Stark tuning range over 100 nm in the 900 nm spectral region have been recently demonstrated (N. Le Thomas, N. T. Pelekanos, Z. Hatzopoulos, E. Aperathitis, R. Hamelin, Appl. Phys. Lett., 81, 1582 (2002)). Possible application of this principle to laser tuning was reported by J. Faist, F. Capasso, C. Sirtori, D. L.Sivco, A. L. Hutchinson and A. Y. Cho (Nature, v.387, 777 (1994)), N. Le Thomas, N. T. Pelekanos, Z. Hatzopoulos, E. Aperathitis, R. Hamelin, (Appl. Phys. Lett., 83, 1304 (2003), Yu. Vasilyev and S. Suchalkin (Electron. Lett., 35, 1563 (1999).

However, the suggested schemes have serious drawbacks. The design suggested by N. Le Thomas, N. T. Pelekanos, Z. Hatzopoulos, E. Aperathitis, R. Hamelin in Appl. Phys. Lett., 83, 1304 (2003) utilizes the emitter based on a "rectangular" type I quantum well, so the Stark shift is a weak second-order effect. In the designs suggested by J. Faist, F. Capasso, C. Sirtori, D. L. Sivco, A. L. Hutchinson and A. Y. Cho (Nature, v.387, 777 (1994)) and by Yu. Vasilyev and S. Suchalkin (Electron. Lett., 35, 1563 (1999)) the charge accumulation region is not separated from the emitter. This makes it difficult to use such designs for laser wavelength tuning since the carrier concentration in the emitter is pinned after the laser generation onset, and generation wavelength cannot be controlled through the Stark shift unless a controlled optical loss is introduced in the laser cavity.

There is a need for an emission source which allows wide-range electrical tuning of the emission wavelength for both laser and LED operation modes.

DETAILED DESCRIPTION

Figure 1:
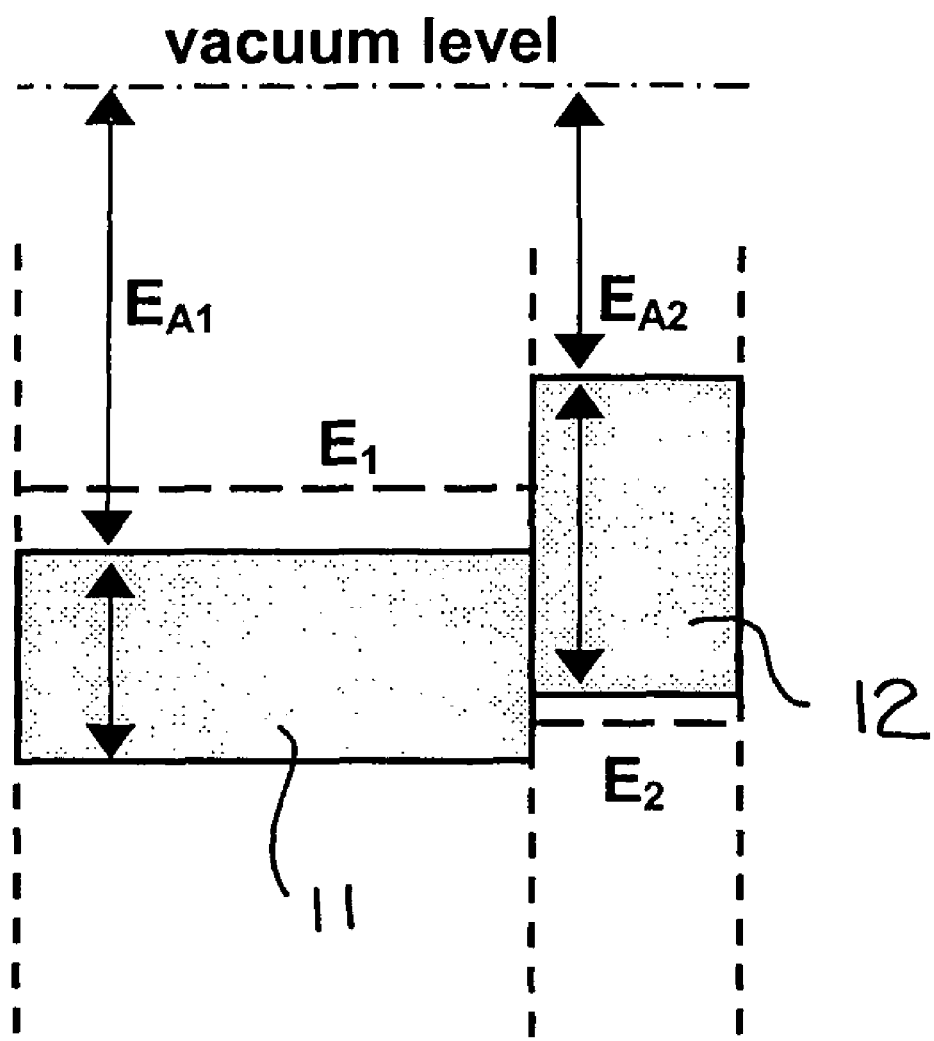
FIG. 1 schematically illustrates an active region of a semiconductor light source with electrically tunable emission wavelength comprising a low electron affinity layer and a high electron affinity layer which form a type II heterostructure in accordance with an embodiment of the present invention.

The present semiconductor structures include a tunable semiconductor light source having an emission wavelength which may be electrically tunable in a wide range. FIG. 1 shows one period of the active region of a semiconductor light source 1 in accordance with an embodiment of the present invention. The semiconductor light source has an electrically tunable emission wavelength provided by two semiconductor layers, 11 and 12, with type-II band alignment. Layer 11 is characterized by higher electron affinity, and layer 12 is characterized by lower electron affinity. As used herein, the terms "higher" and "lower" electron affinity are relative to each other.

The purpose of the active region is to form energy levels $E_1$ and $E_2$ for the optical transition. The radiation wavelength $\lambda$ is related to the energy separation $E=E_1-E_2$:

$$\lambda=hc/E,$$

where h is the Planck constant and c is the light velocity in vacuum. The active region comprises two layers of semiconductor materials with energy band gaps $E_{g1}$ and $E_{g2}$ and affinities $E_{A1}$ and $E_{A2}$ respectively. In order to form a type-II heterojunction, the energy gaps and affinities of the materials should satisfy the relationship:

$$E_{A1}-E_{A2}>E_{g2}-E_{g1}.$$

The higher affinity layer 11 can be made of any suitable material such as quaternary alloy $In_{0.2}Ga_{0.8}As_{0.18}Sb_{0.82}$ or the like. Preferably, the higher affinity layer 11 is not intentionally doped. The lower affinity layer 12 can be made of any suitable material such as ternary alloy $Ga_{0.8}In_{0.2}Sb$ or the like. The lower affinity layer 12 may be p-doped to provide a hole concentration required for effective electron-hole recombination at the type-II interface. The widths of the higher and lower affinity layers 11 and 12 depend on the material used. For example, when the above-noted quaternary and ternary alloys are used as the higher 11 and lower 12 affinity layers, respectively, their thicknesses may be about 40 nm and 6 nm. The criteria for the width selection is described in more detail below.

Figure 2:
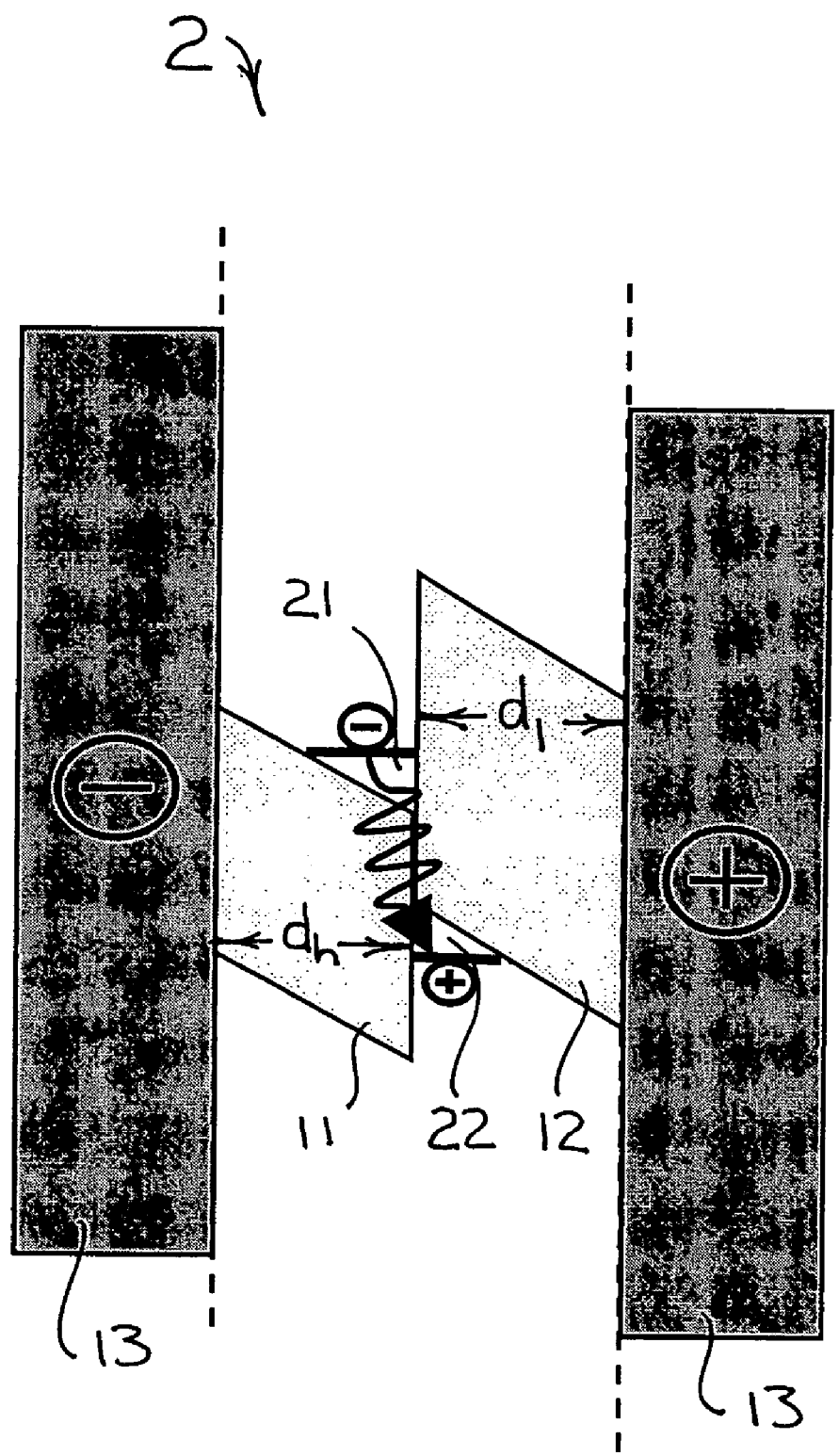
FIG. 2 schematically illustrates a one-period active region of a semiconductor light source with electrically tunable emission wavelength in accordance with another embodiment of the present invention, including electron/hole charge accumulation layers.

The semiconductor light source 2 of FIG. 2 is similar to that of FIG. 1, with the addition of electron/hole charge accumulation layers 13. FIG. 2 shows an exemplary active area under bias condition, when the "minus" of the bias voltage is applied to the high affinity side 11 of the active region. Bias voltage of such a polarity is referred to as "positive bias voltage". The electric field F, created in the active region, leads to formation of triangular potential wells 21 and 22 in the higher 11 and lower 12 affinity layers. The ground state energies $E_{1,2}$ in the wells 21 and 22 depend on the electric field:

$$E_{1,2} \sim F^{2/3}.$$

The electric field F as well as the energy level positions $E_{1,2}$ and, hence, the emission wavelength λ are determined by the applied bias voltage. The widths of the higher $d_h$ and lower $d_l$ affinity layers of the emitter should be large enough to allow formation of triangular potential wells. For the expected bias range, the following condition should be fulfilled:

$$d_{h,l} > E_{1,2}/eF.$$

The bias voltage may be applied to the active region by means of two conducting layers placed on either side of the active region known as charge accumulation layers 13. Due to higher hole effective mass, the energy position of the ground hole subband $E_2$ is much less sensitive to the electric field F than $E_1$.

Figure 3:
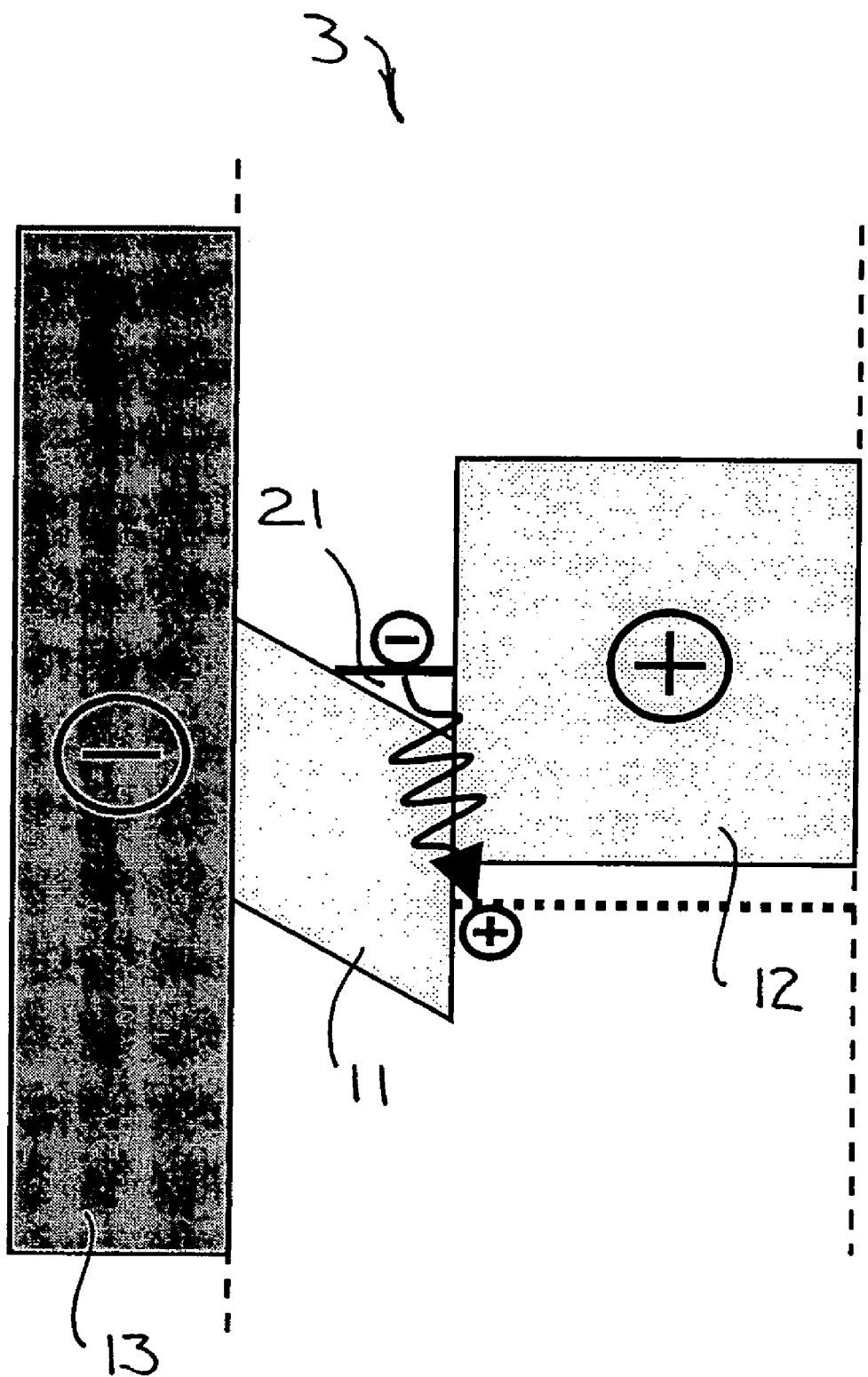
FIG. 3 schematically illustrates a one-period active region of a semiconductor light source in accordance with a further embodiment of the present invention, where a low affinity layer works as a charge accumulation layer.

The p-doped lower affinity layer 12 can be used as one of the charge accumulation layers without sufficient decrease of the tuning range, as shown in FIG. 3. The device 3 of FIG. 3 is similar to that of FIG. 2, except the low affinity layer 12 also acts as a charge accumulation layer.

Figure 4:
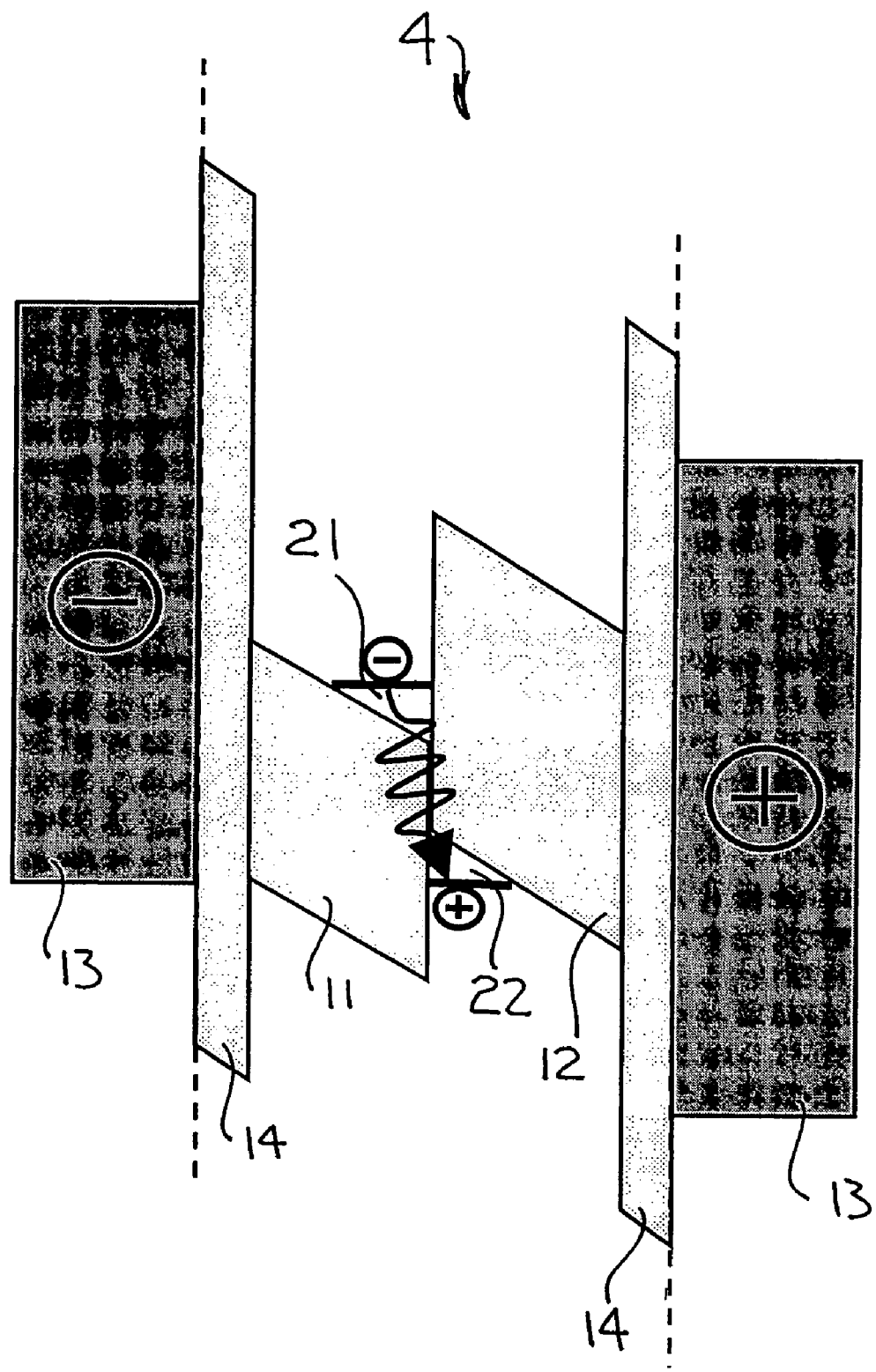
FIG. 4 schematically illustrates a one-period active region of a semiconductor light source similar to that of FIG. 2, where the type II heterostructure is separated from the charge accumulation layers by additional barriers.
Figure 5:
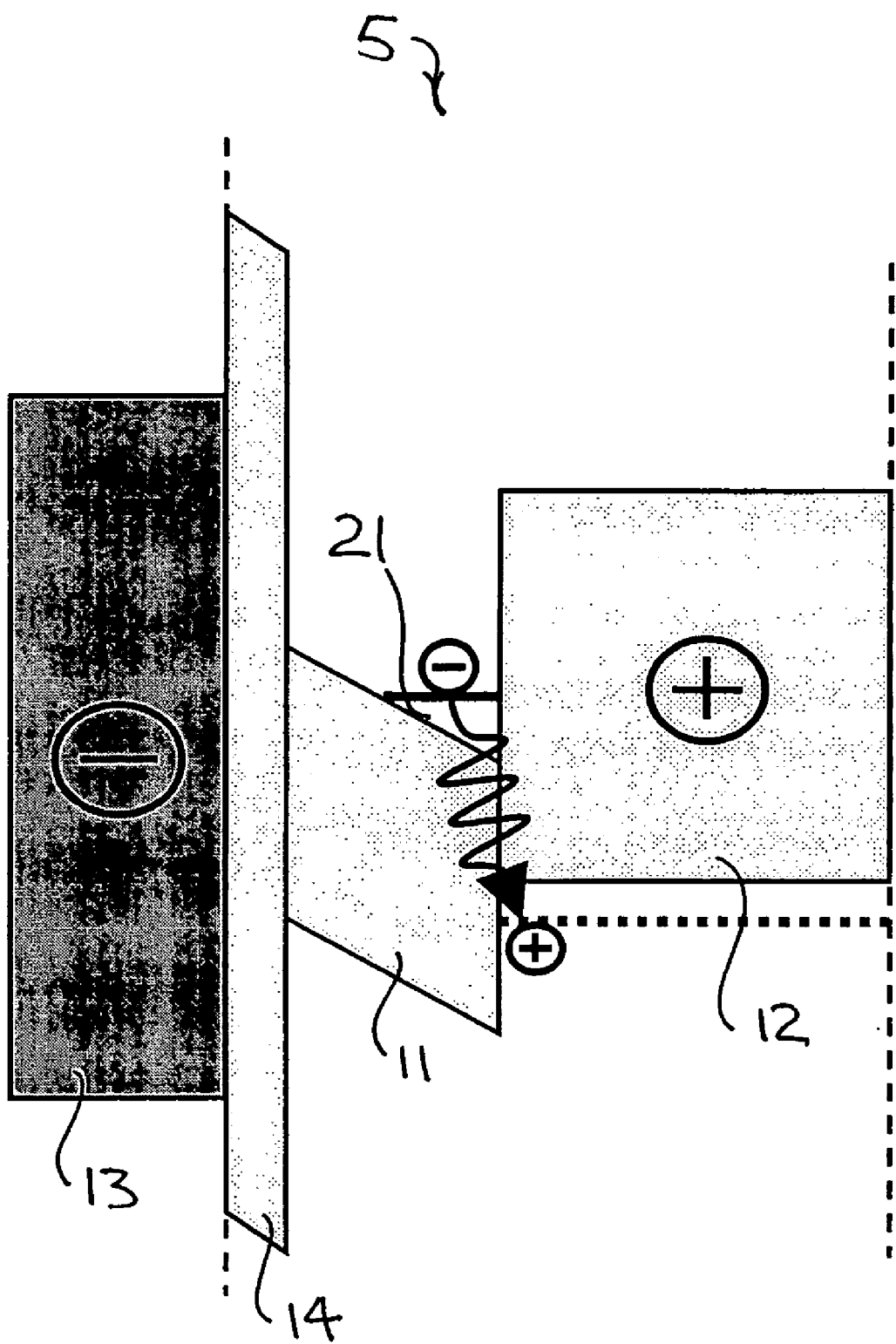
FIG. 5 schematically illustrates a one-period active region of a semiconductor light source similar to that of FIG. 3, where the type II heterostructure is separated from the electron charge accumulation layer by an additional barrier.

FIG. 4 schematically illustrates a one-period active region of a semiconductor light source 4 similar to that of FIG. 2, where the type II heterostructure 11, 12 is separated from the charge accumulation layers 13 by additional barriers 14. As shown in FIG. 4, the semiconductor barrier layers 14 can be used to separate the active region from both of the charge accumulation layer(s) 13. FIG. 5 schematically illustrates a one-period active region of a semiconductor light source 5 similar to that of FIG. 3, where the type II heterostructure 11, 12 is separated from the electron charge accumulation layer 13 by an additional barrier 14. The semiconductor barrier layer 14 is thus used to separate the active region 11, 12 from one of the charge accumulation layers 13. This makes the wavelength tuning possible after the laser threshold, when the carrier concentration in the active area is pinned.

Figure 6:
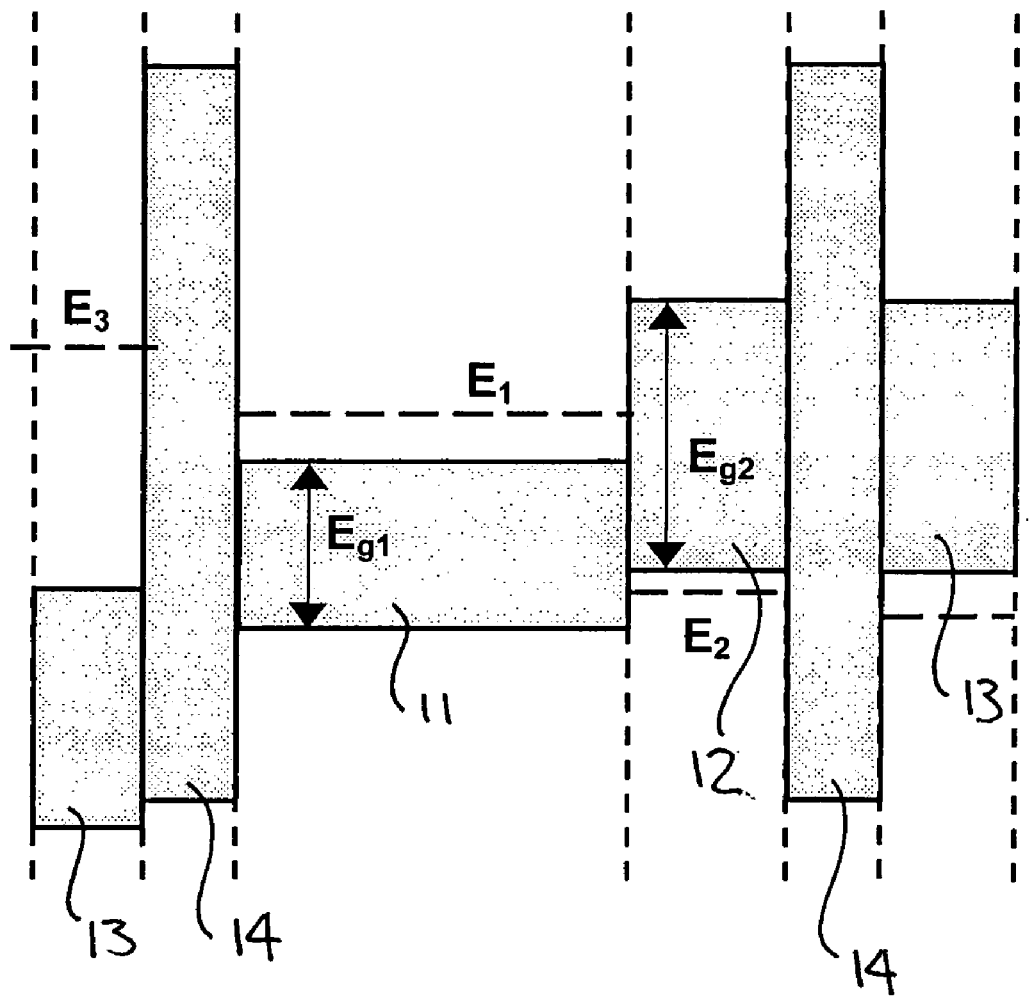
FIG. 6 is a band diagram corresponding to a one-period active region of a semiconductor light source similar to that of FIG. 4, where the charge accumulation layers are electron and hole quantum wells.
Figure 7:
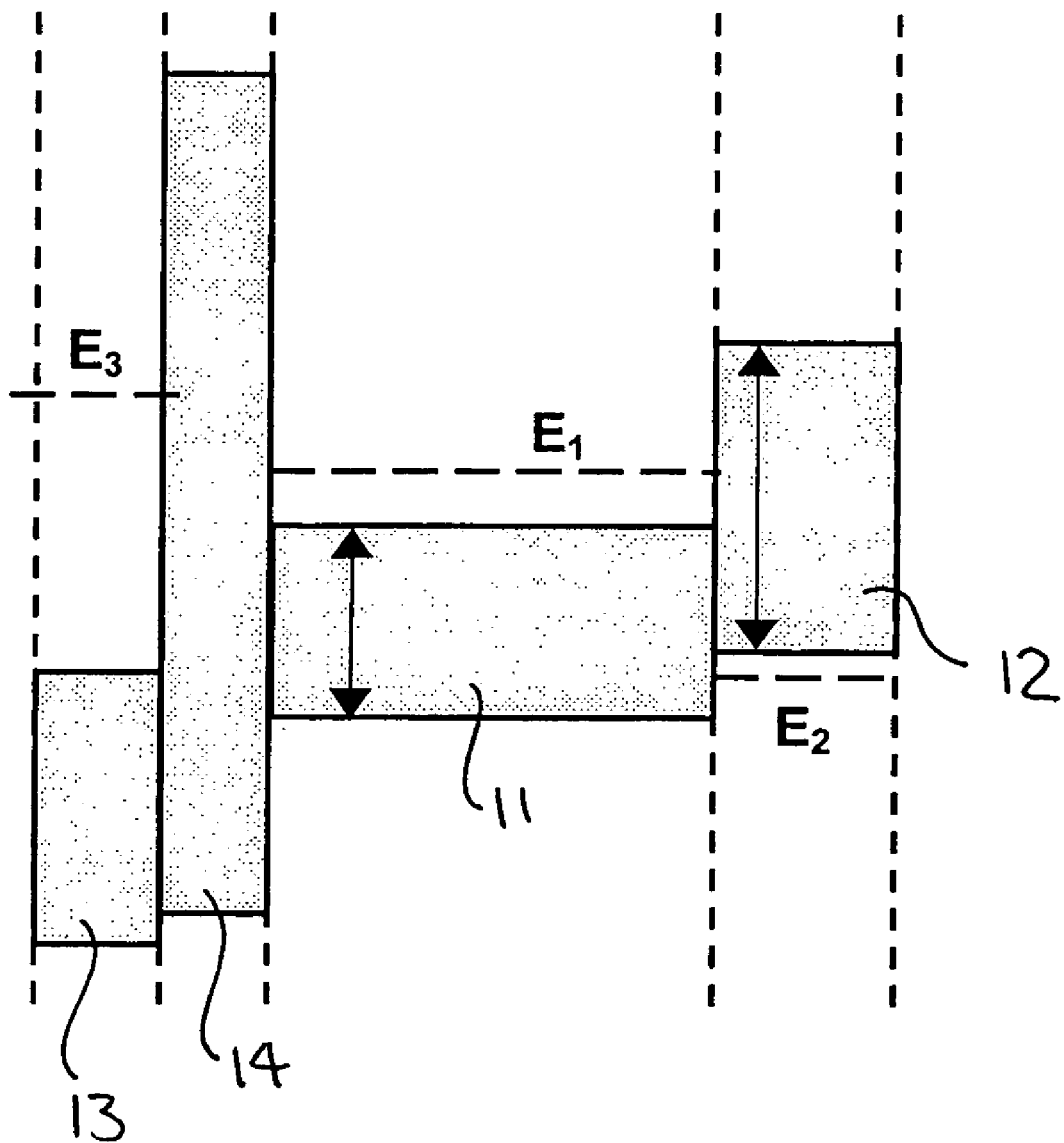
FIG. 7 is a band diagram corresponding to a one-period active region of a semiconductor light source similar to that of FIG. 5, where the charge accumulation layers are electron and hole quantum wells.

Dimensionally quantized quantum wells can be used as the charge accumulation layers, as shown in FIGS. 6 and 7. FIG. 6 is a band diagram corresponding to a one-period active region of a semiconductor light source similar to that of FIG. 4, where the charge accumulation layers 13 are electron and hole quantum wells. FIG. 7 is a band diagram corresponding to a one-period active region of a semiconductor light source similar to that of FIG. 5, where the charge accumulation layer 13 is an electron and hole quantum well.

The charge accumulation layers 13 may be any suitable material and thickness, for example, an InAs layer with a width of 1.7 nm. The tunnel barriers 14 may be any suitable material and thickness, for example, an AlSb layer with a width of 4 nm.

Figure 8:
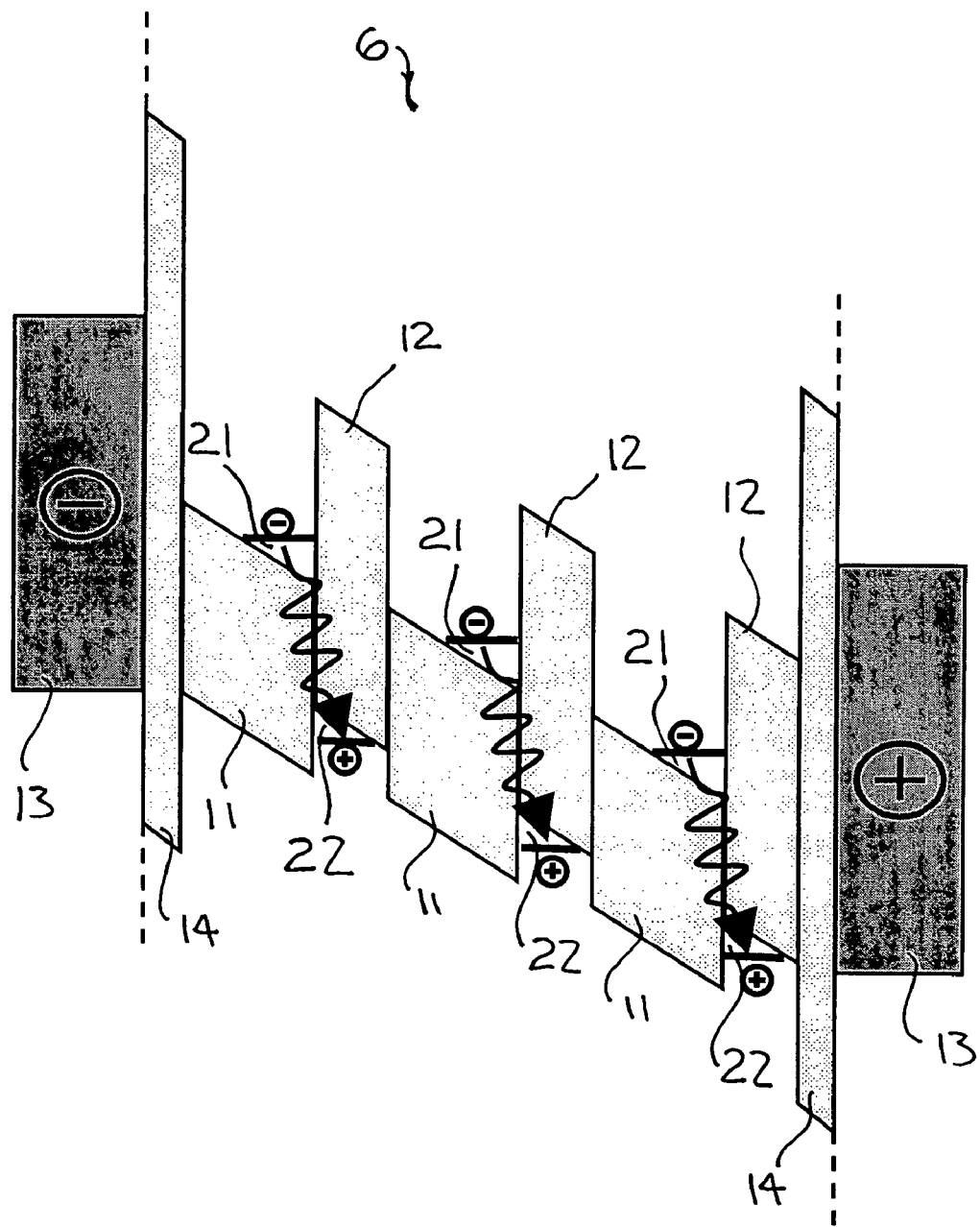
FIG. 8 schematically illustrates an active region of a semiconductor light source which contains multiple type II heterojunctions in accordance with an embodiment of the present invention.

FIG. 8 schematically illustrates an active region of a semiconductor light source 6 which contains multiple type II heterojunctions 11, 12 in accordance with an embodiment of the present invention. As shown in FIG. 8, the active region can contain a number of identical or different heterostructure periods 11, 12 with their type and number chosen to optimize the optical gain or emission spectrum.

Figure 9:
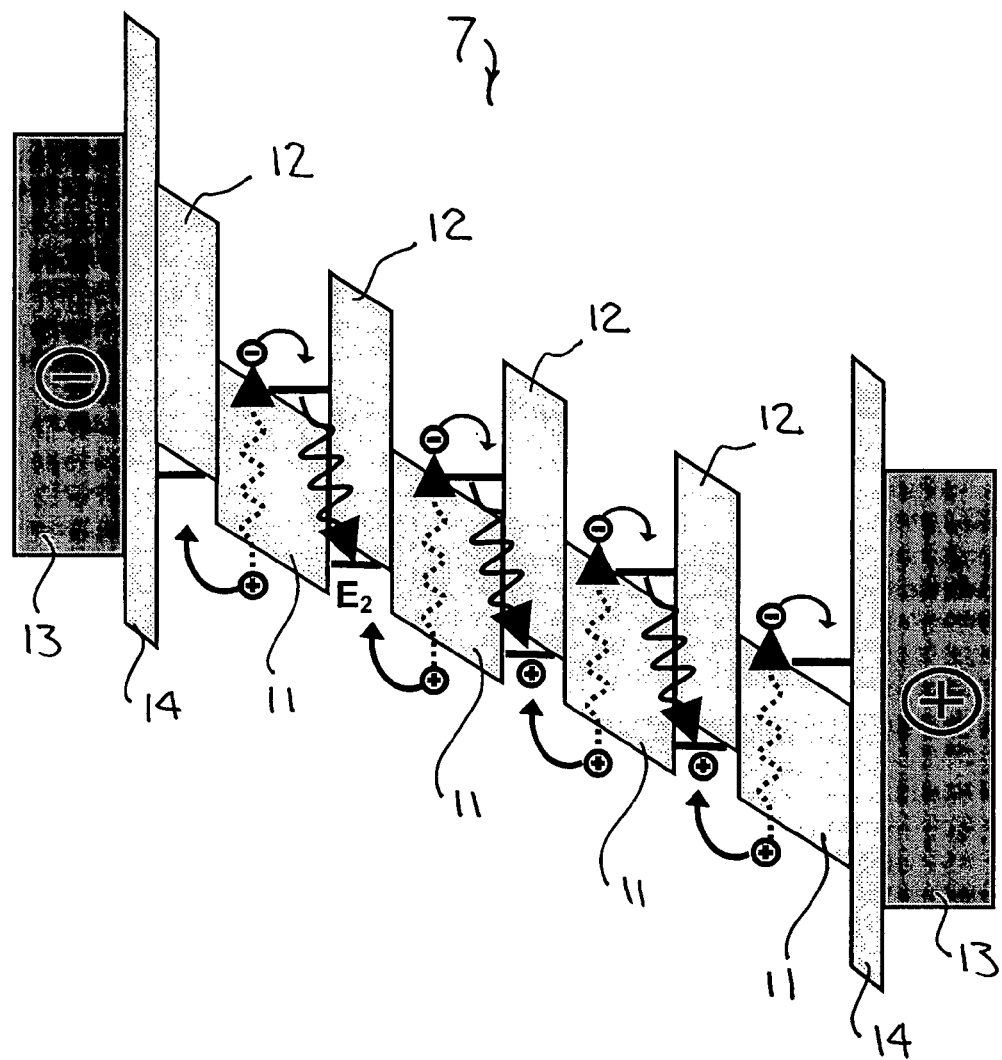
FIG. 9 schematically illustrates an active region of a semiconductor light source similar to that of FIG. 8, where the high affinity layers are used as an absorber for optical pumping.

Electrical or optical injection can be used to provide carriers necessary for the recombination, as shown in FIG. 9. FIG. 9 schematically illustrates an active region of a semiconductor light source 7 similar to that of FIG. 8, where the high affinity layers 11 are used as absorbers for optical pumping.

The carriers created by the optical pumping in the high affinity layers are being trapped in the triangular potential wells, creating the population inversion. In an exemplary embodiment of the device with electrical injection, each period of the active region includes graded gap injectors.

Figure 10:
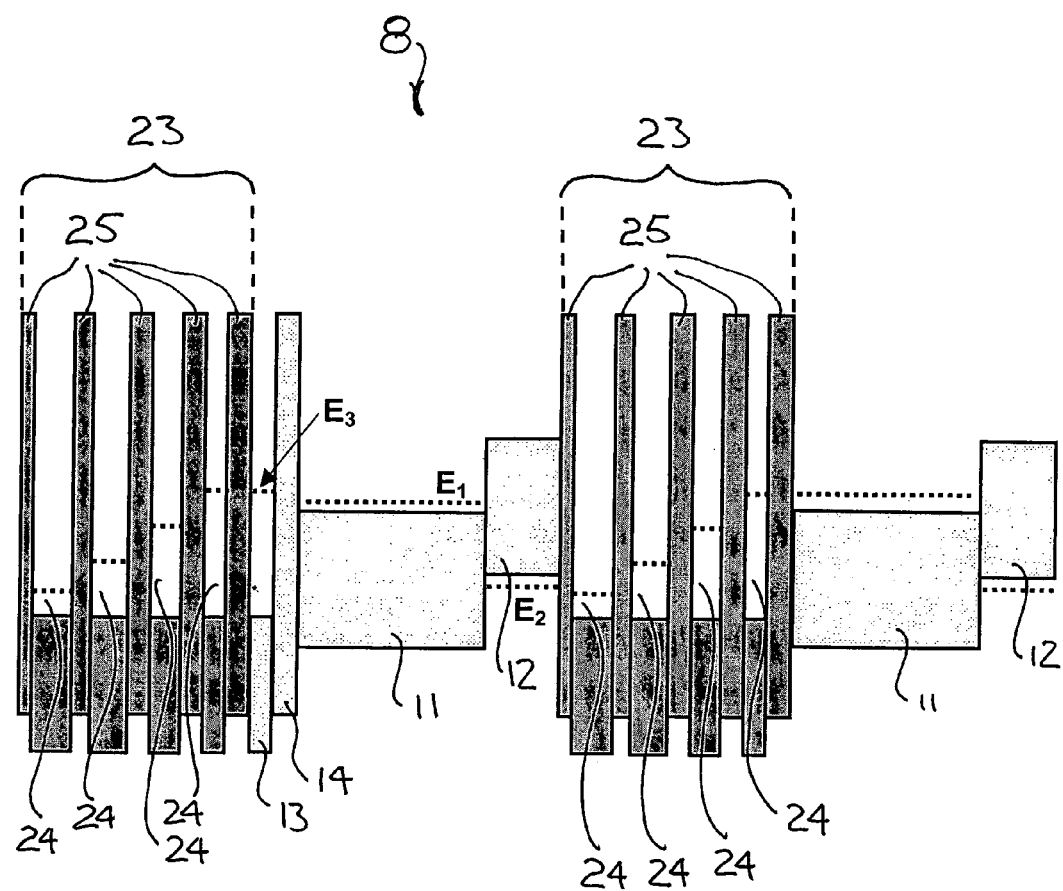
FIG. 10 schematically illustrates the active region of a semiconductor light source similar to that of FIG. 7, where digitally graded superlattices are used to provide cascaded carrier injection.

FIG. 10 schematically illustrates the active region of a semiconductor light source 8 similar to that of FIG. 7, where digitally graded superlattices 23 are used to provide cascaded carrier injection. A digitally graded injector 23 comprises quantum wells 24 of variable width, separated by tunnel barriers 25, so that the ground state energy levels in the wells changes from well to well. The ground state energy in the injector well 13, adjoining the higher affinity layer 11 of the emitter, is aligned with hole Fermi level in that layer. The ground state energy in the injector well 24, adjoining the charge accumulation layer 13, is aligned with the electron ground state in that layer. At a certain direct bias voltage, the ground energy levels in the injector wells line up, allowing the transverse bias electrical current through the structure. The bias electron current, which flows in the direction from higher to lower affinity layer, leads to the electron accumulation in the accumulation layer 13 and to the hole accumulation in the lower affinity layer 12. This results in the electric field build-up and leads to the formation of generally triangular electron potential wells in the higher affinity layers of each period of the active region. As the bias current flows, the electrons tunnel from the charge accumulation layer through the tunnel barrier layer to the triangular potential well and thermalize there to the ground state.

Figure 11:
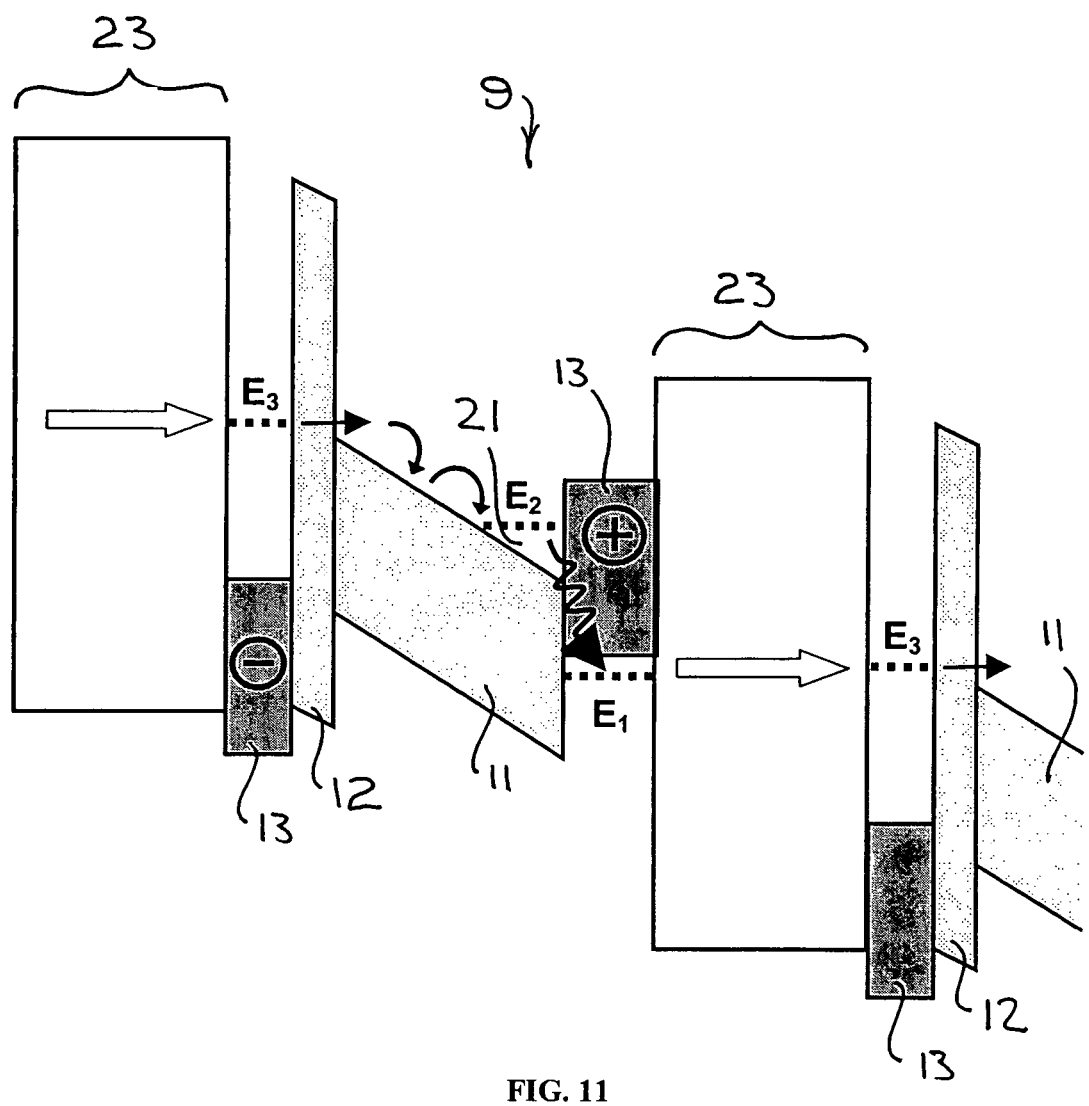
FIG. 11 schematically illustrates the active region of a semiconductor light source similar to that of FIG. 9 at a nonzero transverse bias current through the structure.

FIG. 11 schematically illustrates an active region of a semiconductor light source 9 similar to that of FIG. 9 with superlattice injectors 23 and at a nonzero transverse bias current through the structure. As illustrated in FIG. 11, radiative recombination occurs between the electrons, accumulated in the ground state of the triangular potential well 21 and the holes, accumulated in the ground state of lower affinity layer. The ground state energy in the triangular well and the radiation wavelength depend on the effective electric field in the higher affinity layer. The electron concentration in the accumulation layer as well as the electric field in the higher affinity layer is determined by transverse electrical current, so that the wavelength of the emitted radiation can be tuned by the bias current.

In this case, at least one of the low or high affinity layers of each period of the active region works as a pumping light absorber. Direct bias voltage applied to the active region leads to formation of the triangular potential wells. The electrons and holes, generated by the pumping light, are separated by the bias electric field and accumulate in the triangular wells for further recombination. The output light wavelength in this case is tuned by the bias voltage. The barriers, separating the active area from the charge accumulation layers, can be either nontransparent or partially transparent for carrier tunneling. To ensure the proper voltage distribution between the low- and high-affinity layers of the active area, the low-affinity layers can be p-doped.

Figure 12:
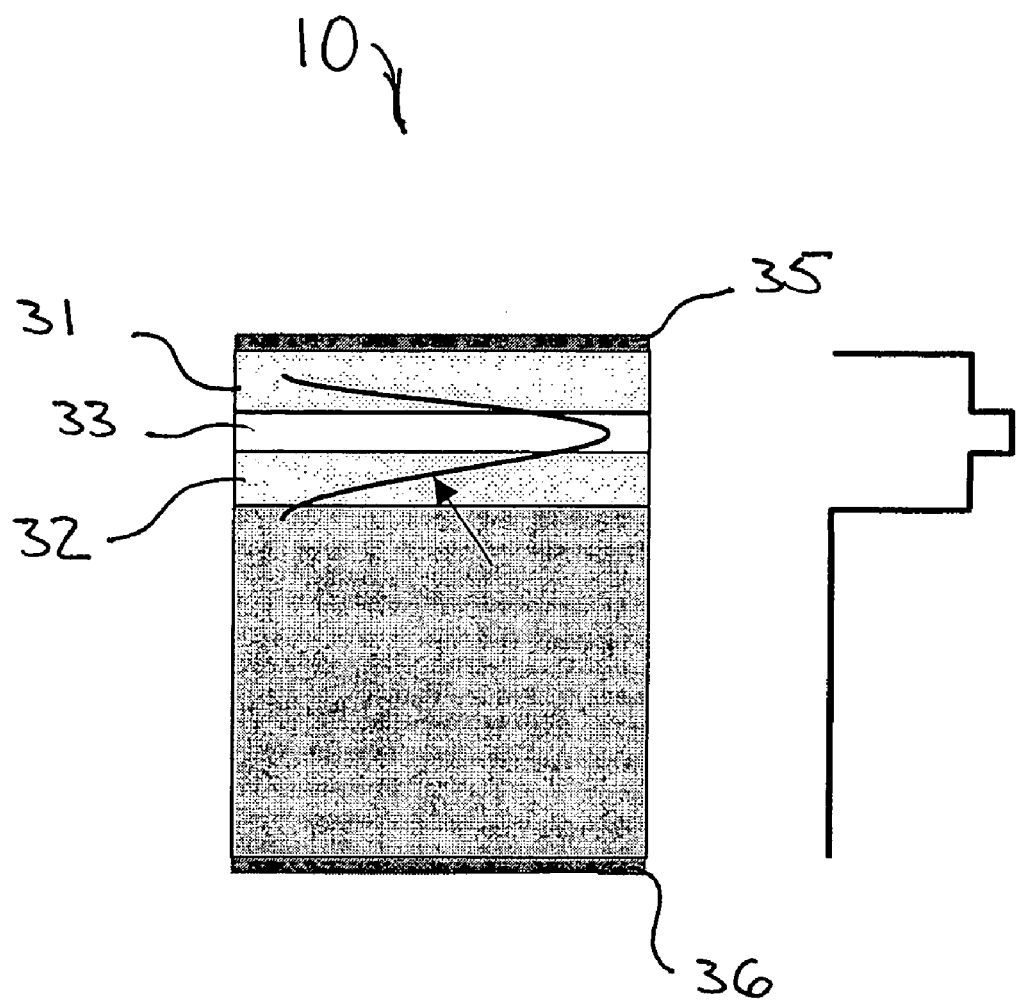
FIG. 12 schematically illustrates the structure and the index profile of a waveguide including a semiconductor light source in accordance with an embodiment of the present invention.

To increase light emission efficiency, the device active area can be embedded into the core of a semiconductor waveguide 10, as shown in FIG. 12. A semiconductor waveguide includes at least three layers: two cladding layers 31 and 32 separated by a waveguide core 33, e.g., active waveguide region. The effective refraction index of the waveguide region material 33 should be higher than those of the cladding layers 31 and 32. This will provide confinement of the emitted light inside the waveguide region 33 and increase light emission efficiency. The waveguide 10 also includes a substrate 34, top contact layer 35, and bottom contact layer 36. The index profile is shown to the right of the waveguide 10.

Figure 13:
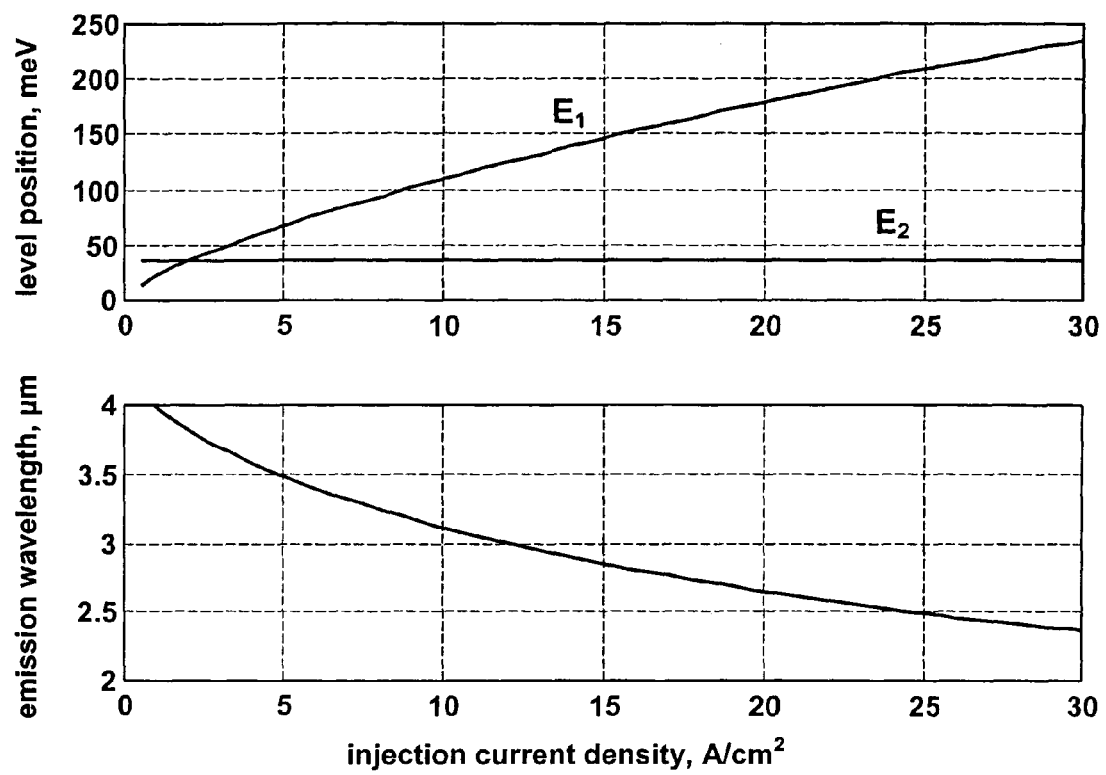
FIG. 13 includes graphs of level position and emission wavelength versus injection current density, showing the estimated dependence of the energy levels participating in optical transition and the emission wavelength on the bias current density for a semiconductor light source in accordance with an embodiment of the present invention.

The graphs of FIG. 13 show the calculated energy level positions and the corresponding wavelength shift as a function of bias current through the structure in accordance with an embodiment of the present invention. A large blue shift occurs in contrast with a negative second-order Stark correction to the ground state. The wavelength tuning is possible even after the lasing threshold is achieved, i.e., when the carrier concentration in the active region is pinned. The confining potential for electrons in the active region is formed by the electric field rather than by conduction band steps. In accordance with the present invention, the tunnel barrier is used to separate the charge accumulation layer from the emitter region. Also, the effective distance separating electrons and holes in the active area is relatively small and depends to some degree on the electric field, thus leading to higher electron-hole wave function overlap, higher emission efficiency, and higher operation stability.

Structures were grown by standard MBE techniques on p-doped GaSb substrates. The active region of each structure consisted of 15 cascades. Each cascade included a digitally graded InAs/AlSb injector and an $In_{0.2}Ga_{0.8}As_{0.18}Sb_{0.82}Ga_{0.8}In_{0.2}Sb$ type II heterostructure, separated by a 4 nm AlSb barrier. The widths of the $In_{0.2}Ga_{0.8}As_{0.18}Sb_{0.82}$ and $Ga_{0.8}In_{0.2}Sb$ layers were 40 nm and 6 nm, respectively. The active area was sandwiched between InAs/AlSb superlattice claddings. The $Ga_{0.8}In_{0.2}Sb$ layer was p-doped to provide the hole concentration necessary for efficient electron-hole recombination at the type-II interface. Due to the higher hole effective mass, the energy position of the ground hole subband $E_2$ is much less sensitive to the electric field than the energy position of the electron subband $E_1$. The p-doped lower-affinity layer can thus be used as one of the charge accumulation layers without substantial decrease of the tuning range. The devices were fabricated as deep-etched mesas and soldered epi-layer side up to copper mounts. The mesas were 0.5-1 mm long and 15-35 µm wide with both facets left uncoated. The mounts were attached to the cold finger of a liquid $N_2$ or He train cryostat, depending on the temperature range needed. The emission was collected with the reflection optics and analyzed with FTIR spectrometer.

Figure 14:
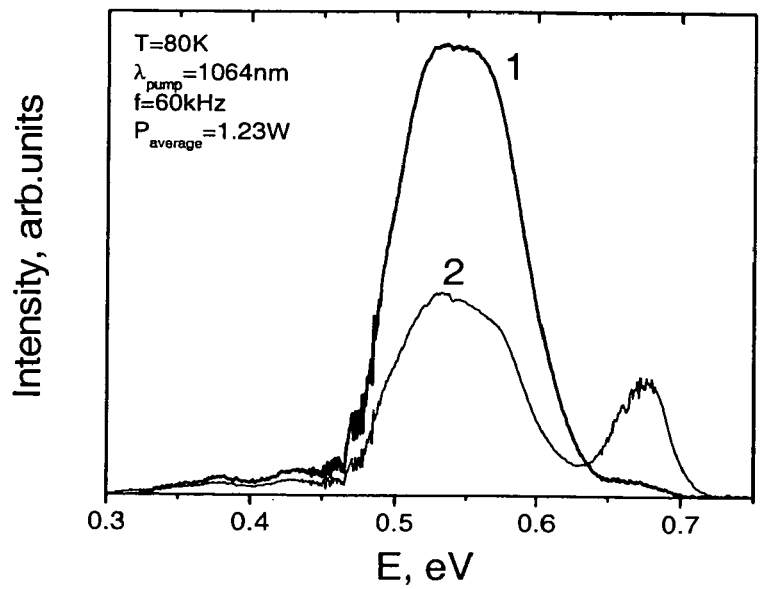
FIG. 14 is a PL spectra of a semiconductor light source structure in accordance with an embodiment of the present invention.

The photoluminescence (PL) spectra of one of the structure are presented in FIG. 14. A Nd:YVO laser (λ=1064 nm) was used as an excitation source. The high energy peak in the spectrum (2) is the luminescence from the cladding InAs/AlSb superlattice. There is no such peak in the PL spectrum of the structure with the etched down upper cladding.

The calculated bandgap of the cladding agrees well with the PL peak energy. The lower energy peak is the luminescence from type II heterojunction. The energy position of the peak is ~540 meV, which is close to the energy gap of $In_{0.2}Ga_{0.8}As_{0.18}Sb_{0.82}$ (~500 meV[14]).

Figure 15:
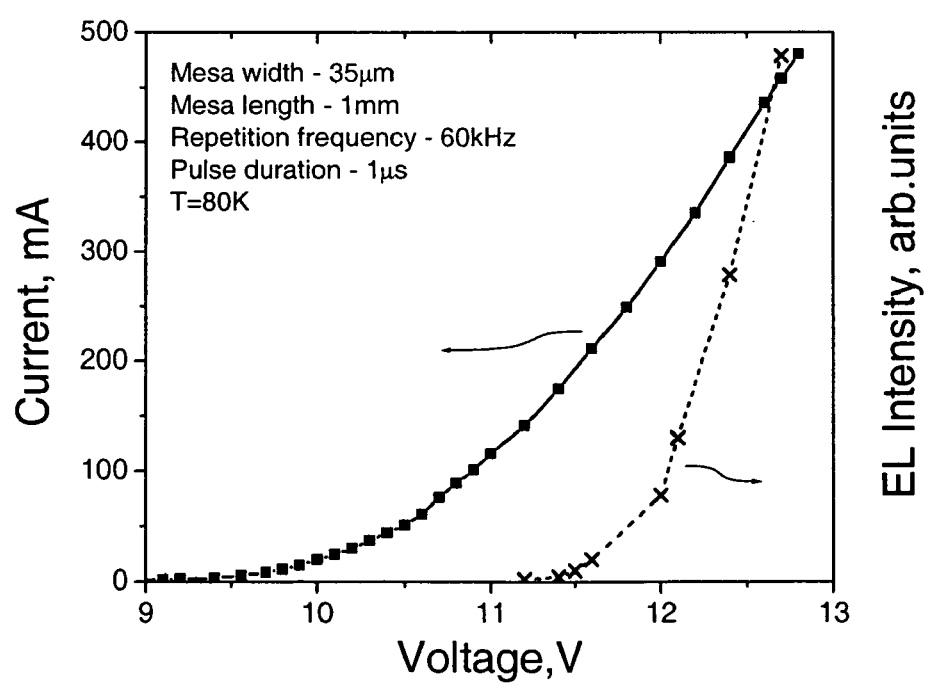
FIG. 15 is a graph of current and EL intensity versus voltage illustrating dependencies of the current and the emission intensity for a semiconductor light source structure in accordance with an embodiment of the present invention.

A typical current-voltage dependence of the structure is shown in FIG. 15. A non-negligible current appears at the voltage about 10V. The main voltage drop occurs on the digitally graded injectors and the type II heterojunctions. The injectors, claddings and transition regions of the structure are similar to those used in type II interband cascade lasers, where the parasitic voltage drop at the contacts $V_{cont}$ is negligibly small. The differential resistance in the voltage range 11-13V is $R_{ser}$~4.5Ω, which is higher than that of a typical ICL laser (~2Ω), recalculated for the same sample geometry). This suggests an additional resistance introduced by the AlSb tunnel barriers and the heterojunctions.

Figure 16:
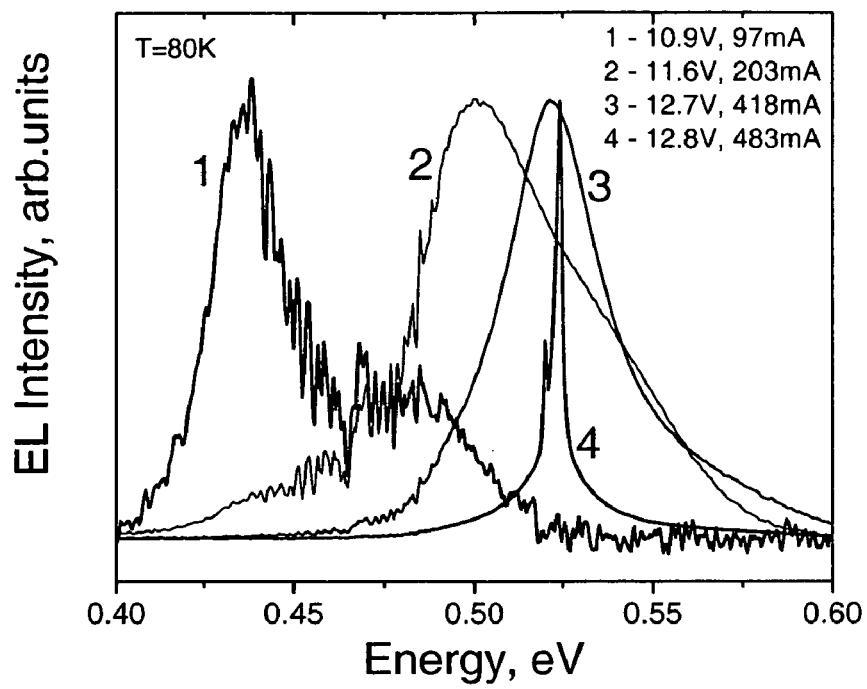
FIG. 16 is a graph of EL intensity versus energy illustrating the electroluminescence at different currents for a semiconductor light source structure in accordance with an embodiment of the present invention.

The electroluminescence (EL) spectra are shown in FIG. 16. As the current increases, the EL spectrum shifts to higher energies and, at the threshold current of ~430 mA the laser generation starts. The additional structure in the high-energy wing of the spectrum, corresponding to the lowest current and voltage, may be due to atmospheric water absorption. The total voltage drop across the structure can be written as:

$$V=V_{cont}+IR_{ser}+N\Delta E/e+N\Delta V \qquad (I),$$

where N=15 is the number of cascades; $\Delta E$~0.3V is the energy difference between the bottom of the conduction band in the $In_{0.2}Ga_{0.8}As_{0.18}Sb_{0.82}$ high affinity layer and the ground hole subband energy in the $Ga_{0.8}In_{0.2}Sb$ low affinity layer; and $\Delta V$~$F(d_h+d_1)$ is the additional voltage drop across the heterojunction (in this estimate the screening effects are neglected).

At the bias current I=97 mA and V=10.9V, the voltage drop through the structure due to nonzero series resistance is ~0.19V. Here we used $R_{ser}$~2Ω, which is a typical series resistance for type II ICL. The estimation of $\Delta V$ gives ~0.4V ($V_{cont}$ is neglected). At the bias current increases to 418 mA, $\Delta V$ becomes 0.5V. These values are in good agreement with the observed shift of the EL spectrum (~75 meV, FIG. 17).

Figure 17:
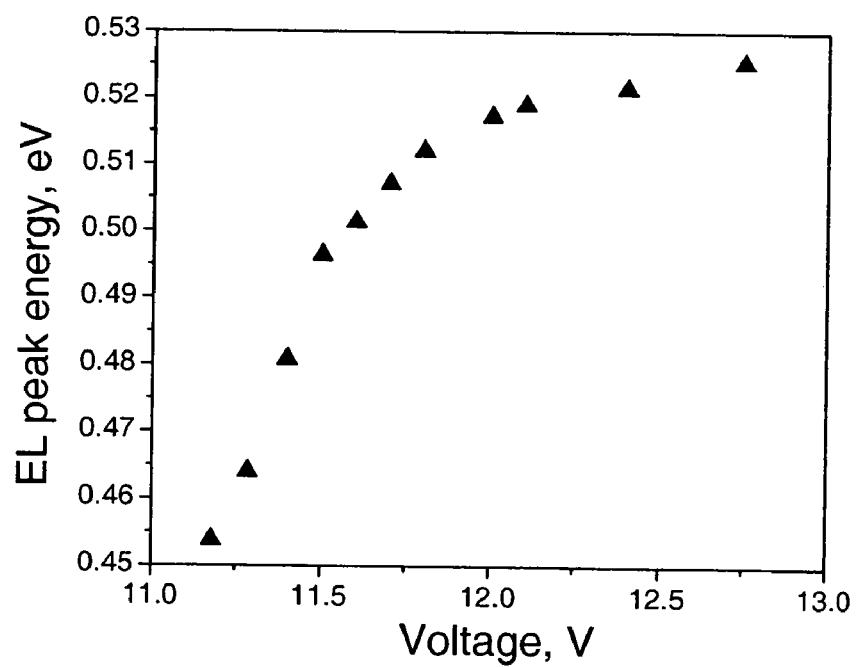
FIG. 17 is a graph of EL peak energy versus voltage illustrating the EL quantum energy versus bias current and voltage for a semiconductor light source structure in accordance with an embodiment of the present invention.

As shown in FIG. 17, at voltages higher than 11.6V there is a strong saturation of EL peak shift which correlates with the onset of amplified spontaneous emission. A possible explanation of such a behavior is the wavelength dependence of the internal optical loss in the structure. At higher bias currents the optical transition energy across the type II heterojunction becomes close to the bandgap of the $In_{0.2}Ga_{0.8}As_{0.18}Sb_{0.82}$ high affinity layer, which means higher absorption loss. The amplification takes place in the spectral range where the optical gain due to population inversion at the type II heterointerface prevails over the loss due to the intrinsic absorption in the $In_{0.2}Ga_{0.8}As_{0.18}Sb_{0.82}$ layer. This may result in the situation when the spectral position of the amplified spontaneous emission remains unchanged while the energy separation between ground electron and hole subbands at the heterointerface increases with the current.

Another possible reason is the hole accumulation in the triangular potential well formed in the valence band of the high affinity layer. Holes can accumulate in this well at electric fields $F_h$>$(\Delta E_{v-E2})/d_h$, where $\Delta E_v$~190 meV is the valence band offset at the type II heterojunction. Even though the hole tunneling rate into this well is lower than the electron tunneling rate through the tunnel barrier, the leaked hole concentration may be considerable because of the low escape rate.

The two possible escape processes for the accumulated holes are the recombination with the electrons in the well next to the tunnel barrier and the recombination with the electrons in the triangular well at the type II heterojunction. The transition matrix element for both processes is severely reduced because of the suppressed wave function overlap by the tunnel barrier in the first case and the spatial separation in the second.

The parasitic hole accumulation in the high affinity layer reduces efficiency of the charge accumulatin and as the bias current increases, the additional voltage drops mostly on the tunnel barrier. Because of this, the wavelength tuning at higher voltages is entirely due to the variation of electron concentration in the self-consistent triangular well and it stops at the laser threshold when the concentration is pinned. A possible remedy in this case is to employ an AlSb/InAs superlattice instead of the quaternary material as an effective high affinity layer. In this case, the effective $\Delta E_v \sim 640$ meV and the electric field range where the tuning is effective both increase more than three-fold.

Another structure was grown by NBE without the thick $In_{0.2}Ga_{0.8}As_{0.18}Sb_{0.82}$ layer but instead included in its place a chirped InAs/AlSb strained layer superlattice (similar to standard IC laser injection structures).

Figure 18:
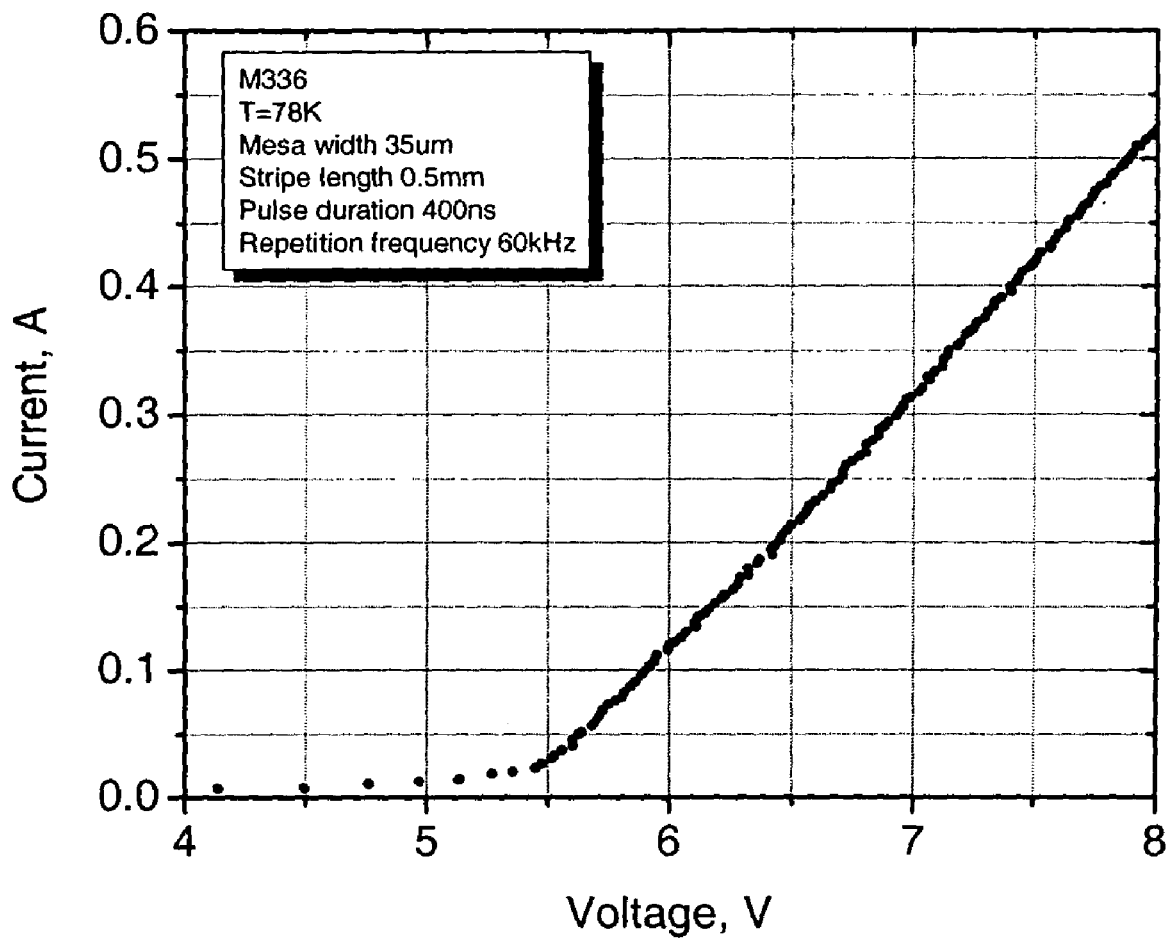
FIG. 18 is a graph of current versus voltage illustrating current voltage characteristics of a semiconductor light source structure in accordance with an embodiment of the present invention.

FIG. 18 shows the pulsed IV characteristic of a 35-micron-wide mesa device from the new sample. The device lased at a 16 mA threshold current, and the differential resistance was relatively constant past the lasing threshold providing a large voltage tuning range for control of the emission wavelength. The device's behavior was close to expectations based on the design: the resonance line-up voltage is about 5V at 78 K, as shown in FIG. 18, the electroluminescence (EL) at low bias is peaked at about 0.34 eV, and the wasted voltage is approximately ~0.24V. Laser emission was observed up to current of 0.65 A (at a bias of approximately 8.3V).

Figure 19:
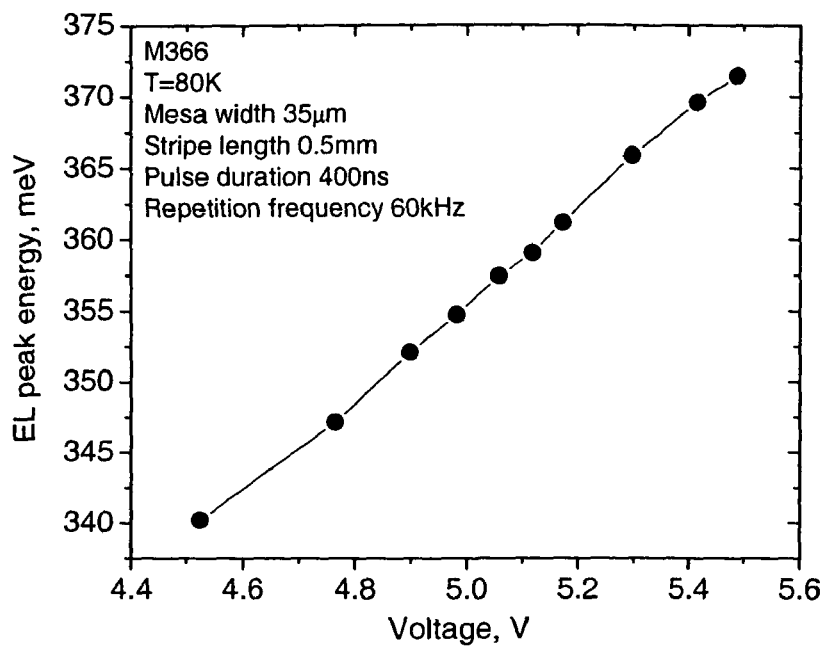
FIG. 19 is a graph of EL peak energy versus voltage for a semiconductor light source structure in accordance with an embodiment of the present invention.
Figure 20:
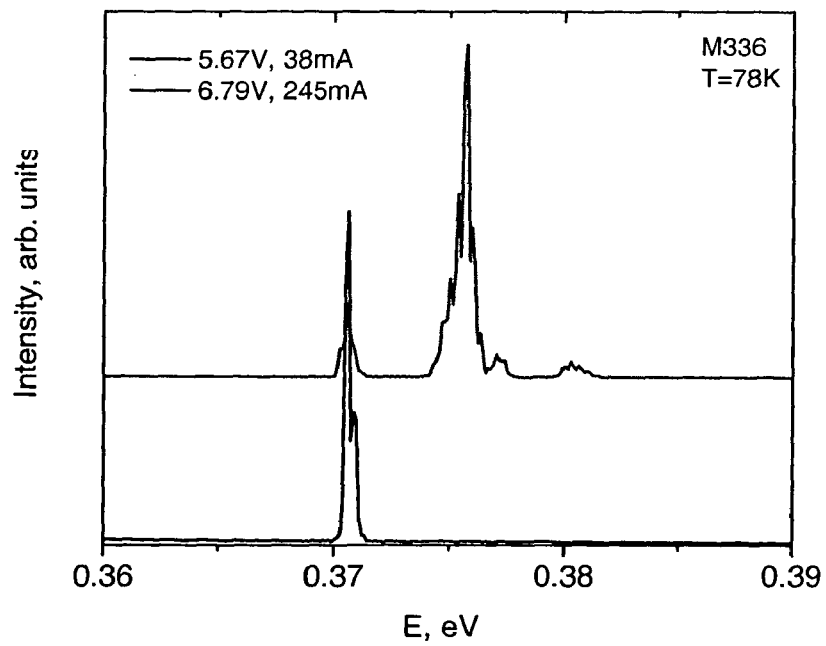
FIG. 20 is a graph of intensity versus energy for a semiconductor light source structure in accordance with an embodiment of the present invention.

As shown in FIG. 19, the EL spectrum shows a steady blue shift with the increasing bias current and voltage, and no saturation of the blue shift was observed. There is also an indication of the blue shift in the laser emission, as shown in FIG. 20, but it is masked by the gain modulation in the device caused by cavity mode leakage. It is expected that thicker lower cladding structures of the same design will show a nice linear lasing emission tuning with applied voltage, similar to that seen from the EL.

Whereas particular embodiments of this invention have been described above for purposes of illustration, it will be evident to those skilled in the art that numerous variations of the details of the present invention may be made without departing from the invention.

The invention claimed is:

1. A tunable semiconductor laser comprising:
   an optically active region including at least one type-II heterojunction comprising a first layer with high electron affinity and second layer with low electron affinity such that the energy separation between electrons in the first layer and holes in the second layer is less than semiconductor bandgaps of both the first and the second layers;
   means for pumping electrons in the first layer and holes in the second layer by applying a bias current to the optically active region with a pair of conducting layers disposed on opposite sides of the optically active region; and
   means for modulating a transverse electric field in the first layer by changing the bias current that is applied to the optically active region by the pair of conducting layers to thereby modulate wavelengths of laser light emitted in a lasing optical transition between electrons in the first layer and holes in the second layer after a lasing threshold of the laser is achieved.

2. The tunable semiconductor laser of claim 1, wherein the pair of conducting layers comprise dimensionally quantized quantum wells.

3. The tunable semiconductor laser of claim 2, wherein the dimensionally quantized quantum wells form a graded-gap injector.

4. The tunable semiconductor laser of claim 1, wherein the pair of conducting layers are further separated from the optically active region by semiconductor barrier layers.

5. The tunable semiconductor laser of claim 4, wherein at least one of the semiconductor barrier layers blocks carrier injection.

6. The tunable semiconductor laser of claim 4, wherein at least one of the semiconductor barrier layers is transparent for carrier injection.

7. The tunable semiconductor laser of claim 1, wherein the optically active region comprises a plurality of heterojunction periods.

8. The tunable semiconductor laser of claim 7, wherein the heterojunctions are substantially identical to each other.

9. The tunable semiconductor laser of claim 7, wherein a number of the heterojunctions is selected to optimize optical gain of the semiconductor laser.

10. The tunable semiconductor laser of claim 1, wherein the optically active region comprises a plurality of different heterojunction periods, and the energy separation between electrons in the first layer and holes in the second layer is different in at least two of the heterojunctions.

11. The tunable semiconductor laser of claim 1, wherein the means for pumping electrons in the first layer and holes in the second layer comprises optical pumping by photons absorbed in the first layer and/or the second layer.

12. The tunable semiconductor laser of claim 1, wherein the means for pumping electrons in the first layer and holes in the second layer comprises diode injection current.

13. The tunable semiconductor laser of claim 1, further comprising a resonant optical cavity providing positive feedback for laser generation.

* * * * *